United States Patent [19]

Komori et al.

[11] Patent Number: 5,138,420
[45] Date of Patent: Aug. 11, 1992

[54] SEMICONDUCTOR DEVICE HAVING FIRST AND SECOND TYPE FIELD EFFECT TRANSISTORS SEPARATED BY A BARRIER

[75] Inventors: Shigeki Komori; Katsuhiro Tsukamoto, both of Hyogo, Japan

[73] Assignee: Mitsubishi Denki Kabushiki Kaisha, Tokyo, Japan

[21] Appl. No.: 608,050

[22] Filed: Oct. 31, 1990

[30] Foreign Application Priority Data

Nov. 24, 1989 [JP] Japan .................. 1-305923
Nov. 30, 1989 [JP] Japan .................. 1-313872

[51] Int. Cl.⁵ .................. H01L 27/02; H01L 27/04
[52] U.S. Cl. .................. 357/42; 357/43; 357/44; 357/46; 357/48; 357/88
[58] Field of Search .................. 357/42, 43, 44, 46, 357/48, 50, 89, 92, 88

[56] References Cited

U.S. PATENT DOCUMENTS 4,786,960 11/1988 Jeuch .................. 357/42
4,805,008 2/1989 Yao et al. .................. 357/48

OTHER PUBLICATIONS

Cheung et al., "Buried Dopant and Defect Layers For Device Structures With High-Energy Ion Implantation", *Nuclear Instruments and Methods in Physics Research*, (1989), pp. 941-950.

*Primary Examiner*—J. Carroll
*Attorney, Agent, or Firm*—Lowe, Price, LeBlanc & Becker

[57] ABSTRACT

A complementary field effect element develops an intensified latch-up preventive property even if the distance between the emitters of parasitic transistors is short, and a method of producing the same are disclosed. The complementary field effect element includes a high concentration impurity layer (16) formed by ion implantation in the boundary region between a P-well (2) and an N-well (3) which are formed adjacent each other on the main surface of a semiconductor substrate (1). Therefore, carriers passing through the boundary region between the P-well (2) and the N-well (3) are decreased, so that even if the distance between the emitters (4, 5) of parasitic transistors is short, there is obtained an intensified latch-up preventive property.

4 Claims, 15 Drawing Sheets ns, the p+ buried layer 15 serves as a high impurity concentration buried layer. Subsequently, the nitride film 22 is removed. As shown in FIG. 9D, with a resist 25 used as a mask, phosphorus P+ is implanted with high energy by ion implantation method. Thereby, the N-well 3 is formed. Simultaneously, phosphorus P+ is implanted with low energy, thereby forming an implanted region 26 for $V_{TH}$ control. As shown in FIG. 9E, a resist 27 is patterned on a region other than the region which is to be formed with the P-well 2. With the resist 27 used as a mask, boron B+ is implanted with high energy. Thereby, the P-well 2 is formed. Boron B+ is implanted with low energy simultaneously with the formation of the P-well 2, whereby an implanted region 28 for $V_{TH}$ control is formed. As shown in FIG. 9F, the resist 27 is removed. Thereby, it follows that the well regions of the CMOS circuit have been formed. As shown in FIG. 9G, the oxide film 21 is removed. As shown in FIG. 9H, a gate oxide film 30 is formed in the region from which the oxide film 21 has been removed. The oxide film 21 is as thick as several 100 μm and hence is not allowed to be used as a gate oxide film requiring a small thickness (100–200 μm). Thus, the gate oxide film 30 need be formed. As shown in FIG. 9I, a polysilicon film 31 serving as a gate electrode is formed on the gate oxide film 30. As shown in FIG. 9J, the portions of the gate oxide film 30 and polysilicon film 31, formed in the regions other than the regions which are to be finally formed with the gate oxide films 10 and 12 and gate electrodes 11 and 13, are etched using photolithography. As shown in FIG. 9K, a resist 32 is formed in a region other than the regions which are to be formed with the n+ diffusion layers 4 and 5 serving as a source and a drain in the P-well 2 and the n+ diffusion layer 9 for fixing the well potential of the N-well 3. With the resist 32 used as a mask, As+ is implanted. Thereby, the diffusion layers 4 and 5 in the P-well 2 and the diffusion layer 9 in the N-well 3 are formed. As shown in FIG. 9L, the resist 32 is removed. A resist 33 is formed in a region other than the regions which are to be formed with the p+ diffusion layers 7 and 8 serving as a source and a drain in the N-well 3 and the p+ diffusion layer 6 for fixing the well potential of the P-well 2. With the resist 33 used as a mask, ion implantation of boron B+ is effected. Thereby, the p+ diffusion layers 7 and 8 in the N-well 3 and the p+ diffusion layer 6 in the P-well are formed. Finally, as shown in FIG. 9M, the resist 33 is removed and source/drain drive is effected to activate the impurities. Simultaneously therewith, the N-well 3 and P-well 2 are also activated. In this manner, the CMOS circuit having a conventional latch-up preventive measure applied thereto is formed.

FIG. 10 is a schematic view for explaining the arrangement of parasitic bipolar transistors and bulk-resistance components in the CMOS circuit shown in FIG. 9. The conventional latch-up preventive measure will now be described with reference to FIG. 10. First, the mechanism of latch-up will be described. The cause of latch-up occurs in both the P-well 2 and N-well 3. That is, the latch-up occurs due such as to the occurrence of hot carriers in the P-well 2 and hot carriers owing to a high electric field near the drain in the N-well 3. A description will now be given on the latch-up due to the hot carriers occurring in the P-well 2. For example, it sometimes happens that holes are produced as hot carriers in the P-well 2. When these holes flow to the diffusion layers 4 and 5 in the P-well 2, this means that currents flow through the bases of NPN transistors 103 and 104, so that collector currents equal to the base currents times current amplification factors flow. That is, currents flow from the N-well 3 to the p+ diffusion layers 4 and 5 in the P-well 2. At this time, currents hardly flow from the p+ diffusion layers 7 and 8 in the N-well 3 owing to the diffusion potential associated with the N-well 3. When a current flows from the n+ diffusion layer 9 in the N-well to the P-well 2, it flows through a bulk-resistance 201 of N-well 3. The voltage produced across said bulk-resistance 201 by said current raises the potential of the bases of the PNP transistors 101 and 102 to turn on PNP transistors 101 and 102. With the PNP transistors 101 and 102 turned on, a current flows through the P-type silicon substrate 1 which forms the collectors of the PNP transistors 101 and 102, and finally the current flows to the p+ diffusion layer 6 in the P-well 2. With this current flowing through a bulk-resistance 202a, a voltage is produced across said bulk-resistance 202a. This voltage raises the base potentials of the NPN transistors 103 and 104, thereby increasing the collector currents in the NPN transistors 103 and 104. As a result, the current flowing through the bulk-resistance 201 further increases. With a positive feedback applied in this manner, a large current remains flowing between $V_{DD}$ and $V_{SS}$ independently of the current due to holes, or hot carriers, which function as a trigger in the beginning. This is the mechanism by which latch-up occurs. Further, even if there is no carrier produced in the beginning, latch-up can occur in the case where noise from the outside makes the voltage on the n+ diffusion layer 5 in the P-well 2 lower than the $V_{SS}$ or makes the voltage on the p+ diffusion layer 8 in the N-well 3 higher than the $V_{DD}$.

To prevent such latch-up, it has been common practice to form the p+ diffusion layer 15 shown in FIG. 9M. Thereby, the bulk-resistance value of the bulk-resistance 202b can be lowered. Consequently, the currents flowing through the collectors of the PNP transistors 101 and 102 flow downward to pass through the p+ buried layer 15. Therefore, even if the same currents as in the prior art flow from the p+ diffusion layers 7 and 8 in the N-well 3 to the p+ diffusion layer in the P-well 2 via the P-type silicon substrate 1, the voltage produced across the bulk-resistance 202b becomes lower. As a result, there is obtained an effect that the NPN transistors 103 and 104 are less easy to turn on. Further, since the p+ diffusion layer 15 is formed in the region corresponding to the bases of the NPN transistors 103 and 104, there is another effect that the gains of the NPN transistors 103 and 104 are decreased. In this manner, in the prior art, the p+ buried layer 15 is formed to extend parallel with the main surface of the P-type silicon substrate and in a region deeper than the P-well 2 and N-well 3 of the P-type silicon substrate, thereby lowering the bulk-resistance value of the bulk-resistance 202 which has been a cause for raising the base potentials of the NPN transistors 103 and 104 so as to prevent latch-up.

As described above, in the conventional CMOS circuit, the p+ buried layer 15 is formed in a region deeper than the region where the P-well 2 and N-well 3 of the P-type semiconductor substrate 1 are formed, so as to prevent latch-up.

However, as CMOS circuits are made finer such that the distance between the p+ diffusion layer 7 in the N-well 3 and the n+ diffusion layer 4 in the P-well is shorter, the carriers flowing through the PNP transistors 101 and 102 find it easier to pass through the wall between the N-well 3 and P-well 2 than through the p+ diffusion layer 15. This results in a disadvantage that the effect provided by the p+ buried layer 15 is greatly decreased.

That is, the collector currents of the PNP transistors 101 and 102 pass through the wall between the N-well 3 and the P-well 2 rather than through the buried layer 15, flowing into the P-well 2. And finally, it flows into the p+ diffusion layer 6 in the P-well 2. FIG. 11 is a schematic view for explaining parasitic transistors and bulk-resistance components when CMOS circuits are made finer. Referring to FIG. 11, with this current path, a new bulk-resistance 202c in the P-well 2 raises the base potentials of the NPN transistors 03 and 104, so that they are turned on, a fact which means that even if the bulk-resistance value of the bulk-resistance 202 is decreased by the p+ buried layer 15, there is no effect of making it less easy to turn on the NPN transistors 103 and 104. Further, since the currents flowing through the bases of the NPN transistors 103 and 104 do not pass through the p+ buried layer 15, the effect of lowering the gains of the NPN transistors 103 and 104 is also lost. Therefore, a new disadvantage arises that the gains of the NPN transistors 103 and 104 become greater than when said currents flow through the p+ buried layer 15. In addition, as the elements are made finer, the PNP transistors 101 and 102 which have been operating longitudinally become operative laterally. Thus, another disadvantage arises that the gains of the PNP transistors 101 and 102 become further increased. As a result, there has been a problem that it is impossible to effectively prevent latch-up.

More particularly, in CMOS circuits having the conventional latch-up preventive measure applied thereto, when the distance between the emitters of parasitic transistors is decreased, the carriers of the currents flowing through the NPN transistors pass through the lateral surface of the well without passing through the P+ buried layer, there has been a problem that latch-up cannot be prevented effectively by the p+ buried layer 15. Furthermore, even if an improved structure effective for preventing latch-up is newly developed, there occurs a disadvantage that the manufacturing steps of such a structure become complicated, resulting in another problem that the efficiency of production is not enhanced.

SUMMARY OF THE INVENTION

An object of the invention is to improve the latch-up preventive property of a complementary field effect element in the case where the distance between the emitters of parasitic transistors is short.

Another object of the invention is to lower the gains of parasitic transistors with respect to carriers passing through the boundary region between first and second electrically conductive-type impurity layers in a complementary field effect element.

A further object of the invention is to form a high concentration impurity layer without complicating the method of producing complementary field effect elements.

In brief, in a first aspect of the invention, a semiconductor device having first and second type field effect transistors includes a first electrically conductive substrate having a main surface, a first electrically conductive-type impurity layer as a first well within which is formed the first type field effect transistor and a second electrically conductive-type impurity layer as a second well within which is formed the second type field effect transistor, the first and second electrically conductive-type impurity layers formed adjacent each other in the main surface of the first electrically conductive-type semiconductor substrate, a first electrically conductive-type buried layer (15) of an impurity concentration density greater than that of the first conductivity-type substrate in a region thereof underlying the first and second electrically conductive-type impurity regions, a thick field oxide film formed between the first and second electrically conductive-type impurity layers (2, 3) in the main surface of said first electrically conductive-type semiconductor substrate, and an impurity layer (16) having an impurity concentration density greater than that of the first conductivity-type substrate formed in the boundary region between the first and second electrically conductive-type impurity layers, extending from the thick field oxide film to the first electrically conductive-type buried layer.

In operation, since the high concentration impurity layer is formed by ion implantation in the boundary region between the first and second electrically conductive-type impurity layers, the gains of parasitic transistors can be lowered with respect to carriers passing through the boundary region between the first and second electrically conductive-type impurity layers.

In a second aspect of the invention, a method of producing a semiconductor device having first and second type field effect transistors comprises the steps of forming by ion implantation a first electrically conductive-type buried layer of an impurity concentration density greater than that of a first electrically conductive-type substrate in a region thereof underlying the first and second electrically conductive type impurity regions, and forming by ion implantation, in the boundary region between the regions where the first and second electrically conductive-type impurity layers are formed, a high concentration impurity layer by using a resist having the same pattern as that of the resist used for forming the first or second electrically conductive-type impurity layer.

In operation, since the boundary region between the regions where the first and second electrically conductive-type impurity layers are formed, the high concentration impurity layer is formed by using a resist having the same pattern as that of the resist used for forming the first or second electrically conductive-type impurity layer and by ion implantation with the same implantation intensity as that used when forming the first electrically conductive-type high concentration buried layer, there is no need for adding a resist forming pattern for forming a resist used when forming the high concentration impurity layer.

In a third aspect of the invention, a method of producing a semiconductor device having first and second type field effect transistors comprises the steps of forming by ion implantation a first electrically conductive-type buried layer of an impurity concentration density greater than that of the first electrically conductive-type substrate in a region thereof underlying the first and second electrically conductive-type impurity regions, patterning a resist which opens with a predetermined width on the first electrically conductive-type semiconductor substrate at a position corresponding to the boundary region between the first and second electrically conductive-type impurity layers, and forming by ion implantation a high concentration impurity layer in the boundary region between the first and second electrically conductive-type impurity layers by using the resist.

In operation, since the resist which opens with a predetermined width is formed at a position corresponding to the boundary region between the first and second electrically conductive-type impurity layers and since the high impurity layer is formed in the boundary between the first and second electrically conductive-type impurity layers by ion implantation, the impurity can be implanted directly in the semiconductor substrate without intermediary of a resist.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 10 and 8 are schematic views for explaining parasitic transistors and bulk-resistance components in the CMOS circuit shown in FIG. 9M.

DESCRIPTION OF THE PREFERRED EMBODIMENTS

Figure 1:
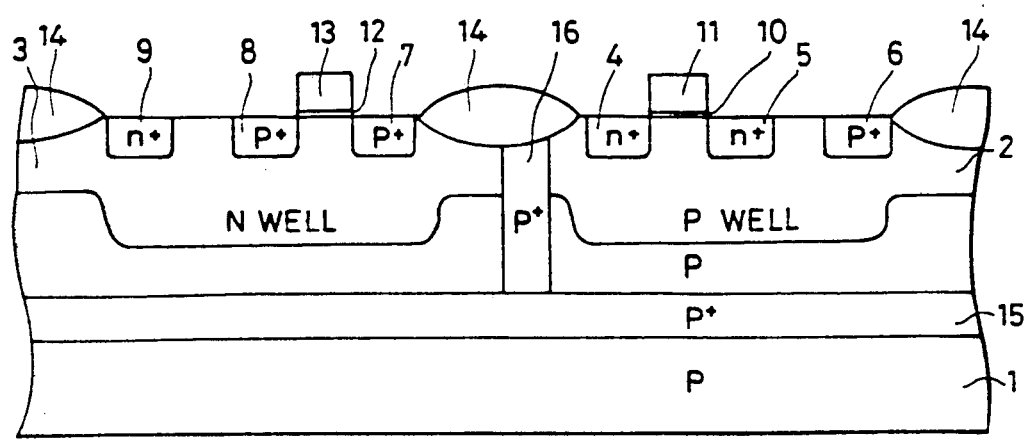
FIG. 1 is sectional structural view of a CMOS circuit having a latch-up preventive measure having applied thereto, showing an embodiment of the invention.

Referring to FIG. 1, a CMOS circuit comprises a P-type silicon substrate 1, a P-well 2 and an N-well 3 formed adjacent each other on the P-type silicon substrate 1, n+ diffusion layers 4 and 5 formed on the P-well 2 and serving as the source and drain of an N-channel transistor, a p+ diffusion layer 6 for fixing the well potential of the P-well 2, p+ diffusion layers 7 and 8 are formed on the N-well and serving as the source and drain of a P-channel transistor, an n+ diffusion layer 9 formed on the N-well 3 and serving to fix the well potential of the N-well 3 of the N-well 3, a gate electrode 11 formed between the n+ diffusion layers 4 and 5 on the P-well 2 through a gate oxide film 10, a gate electrode 13 formed between the p+ diffusion layers 7 and 8 on the N-well 3 through a gate oxide film 12, a field oxide film 14 formed between the n+ diffusion layer 4 and p+ diffusion layer 7 and serving to isolate the elements, a p+ buried layer 15 formed in a region deeper than the P-well 2 and N-well 3 of the P-type silicon substrate 1 and along the main surface, and a p+ high concentration layer 16 formed in the boundary region between the P-well 2 and N-well 3.

Figure 2:
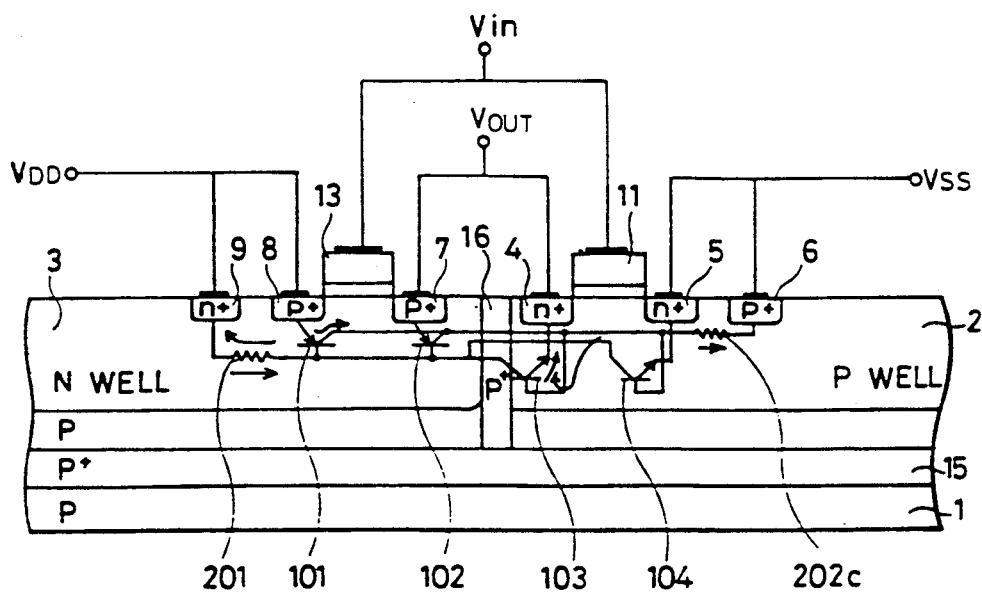
FIG. 2 is a schematic view for explaining parasitic transistors and bulk-resistance components in the CMOS circuit shown in FIG. 1.

Referring to FIG. 2, in this embodiment, by forming the p+ high concentration layer 16 in a region of the P-well 2 adjacent the N-well 3, the concentration associated with the collectors of the NPN transistors 103 and 104 is increased to lower the gains of the NPN transistors 103 and 104. Thereby, in the case where the distance between the p+ diffusion layer 7 in the N-well 3 and the n+ diffusion layer 4 in the P-well 2 becomes shorter, there is formed a current path such that the carriers flowing through the PNP transistors 101 and 102 pass through the lateral surface of the N-well 3 to reach the p+ diffusion layer 6 in the P-well 2 without passing through the p+ diffusion layer 15; thus, even if the NPN transistors 103 and 104 are turned on, there is not much collector current flowing through the NPN transistors 103 and 104. As a result, it becomes harder for the NPN transistors 101 and 102 to turn on.

In this manner, in this embodiment, the formation of the p+ high concentration layer 16 in the portion of the P-well 2 bordering the N-well 3 lowers the gains of the NPN transistors 103 and 104, decreasing the current flowing through the bulk-resistance 201 which forms the cause of increasing the base potentials of the PNP transistors 101 and 102, thereby making it harder to turn on the PNP transistors. As a result, it also becomes harder to turn on the NPN transistors 103 and 104, so that even when the distance between the emitters of the parasitic transistors is short, latch-up can be effectively prevented.

Figure 3A:
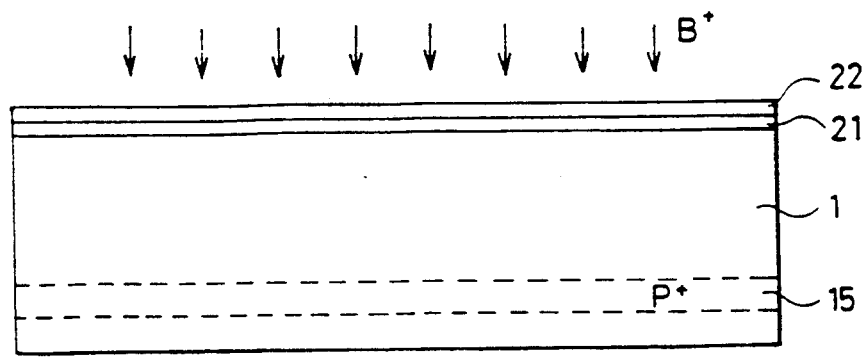
FIGS. 3A through 3L are sectional structural views for explaining an embodiment of the method for producing the CMOS circuit shown in FIG. 1.

Referring to FIGS. 3A through 5, one embodiment of the production process will now be described. As shown in FIG. 3A, an oxide film 21 of $SiO_2$ is formed on the P-type silicon substrate 1. A nitride film 22 of $Si_3N_4$ is formed on the oxide film 21. Thereafter, ion implantation of boron $B^+$ is effected with high energy to form a p+ buried layer 15. As shown in FIG. 3B, the same P-well resist mask 27 as that used in forming a P-well 2 to be later described is patterned on the nitride film 22. With the P-well resist 27 used as a mask, ion implantation of boron $B^+$ is effected under the conditions 200 keV – 10 MeV, $1\times10^{12} - 1\times10^{15}$ cm$^{-2}$. By this ion implantation, the $B^+$ ions fed through the cross section of the P-well resist mask 27 pass through the resist mask 27 and are implanted again in the P-type silicon substrate. And the boron $B^+$ fed into the edge portion of the P-well resist mask 27 and coming out of the cross section of the P-well resist mask 27 is implanted again in the P-type silicon substrate 1. Thereby, a p+ high concentration layer 16 is formed in the boundary portion between the P-well 2 and N-well 3 to be formed in a process to be later described around the edge cross section of the P-well resist mask 27. This method of forming the high concentration layer beneath the edge of the mask is disclosed in, for example, "Buried Dopant and Defect Layers for Device Structures with High-Energy Ion Implantation," in Nuclear Instruments and Methods in Physics Research B37/38 (1989), pp. 941-950.

Figure 3B:
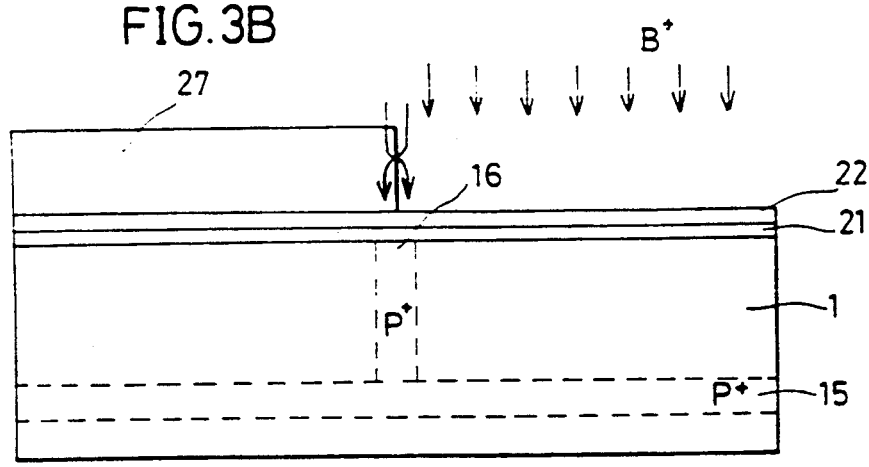
Figure 4:
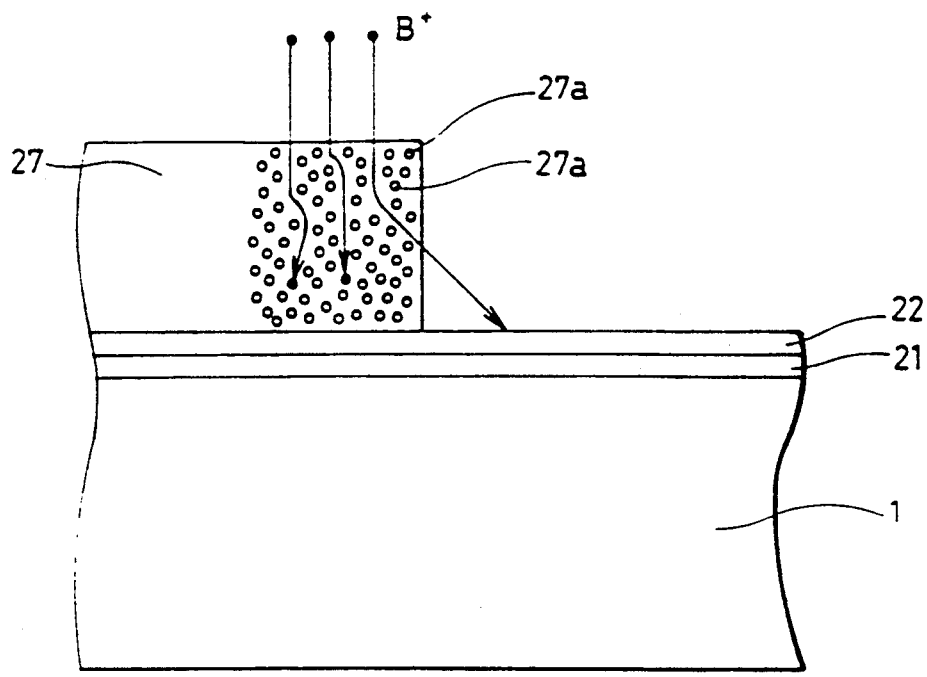
FIG. 4 is a schematic view for explaining the principle of forming a p+ high concentration impurity layer beneath a mask edge in the manufacture process shown in FIG. 3B.

FIG. 4 is a schematic view for explaining the principle of forming the p+ high concentration layer beneath the mask edge in the manufacture process shown in FIG. 3B. Referring to FIG. 4, the boron $B^+$ ions implanted in the resist 27 collide with resist constituting atoms 27a, which block the advance of $B^+$ ions. Portions of the $B^+$ ions which have collided with the atoms 27a stay within the resist 27, while the other thereof spring out of the resist 27 due to the collision with the atoms 27a and are then implanted again into the P-type silicon substrate 1. The $B^+$ ions which have sprung out of the resist 27 have their energy decreased due to the collision with the resist constituting atoms 27a. Therefore, if they are implanted again into the P-type silicon substrate 1 in this state, this results in the formation of the p+ high concentration layer 16 beneath the edge of the resist 27.

Figure 3C:
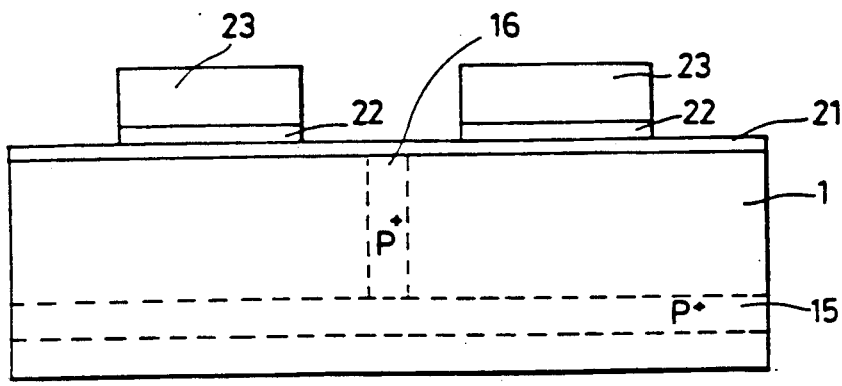
Figure 3D:
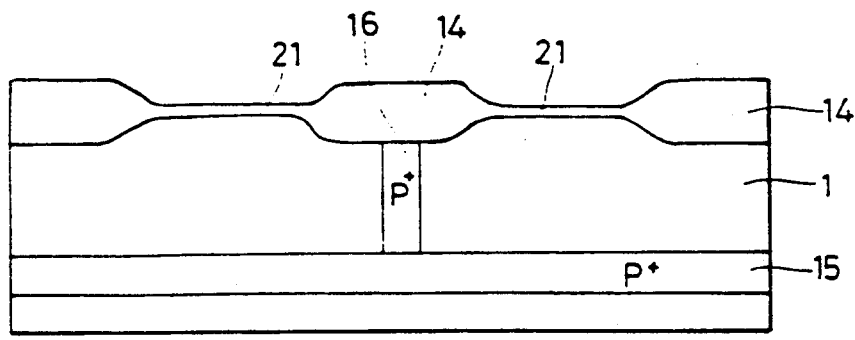
Figure 3E:
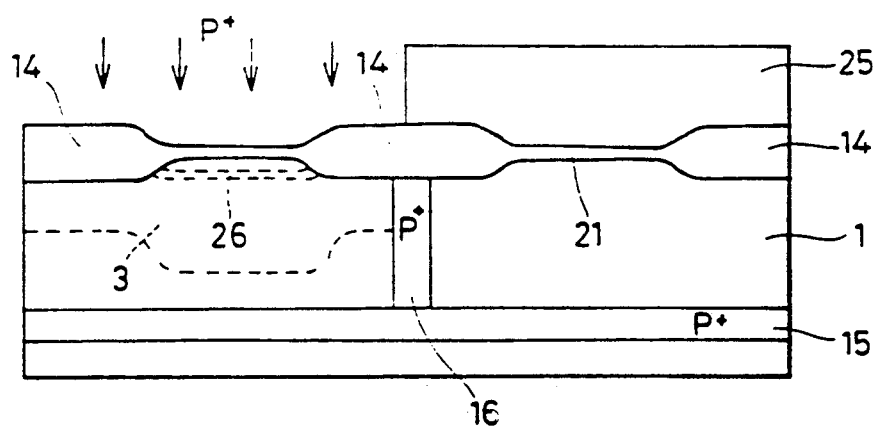
Figure 3F:
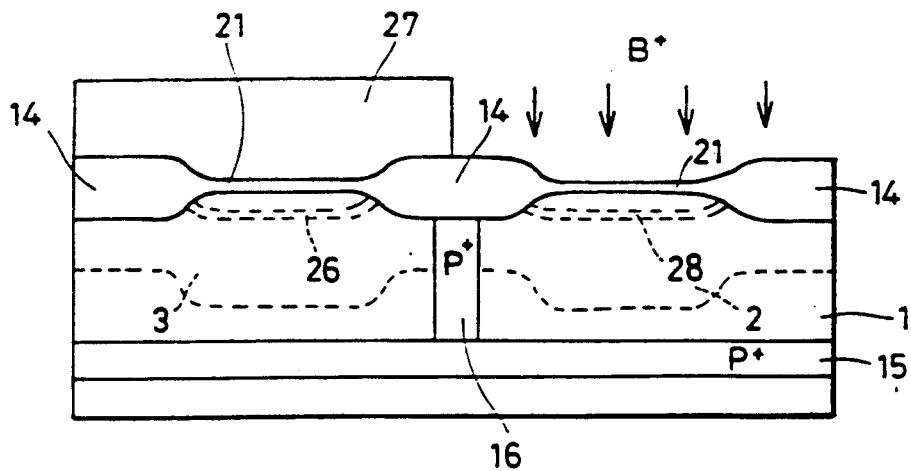
Figure 3G:
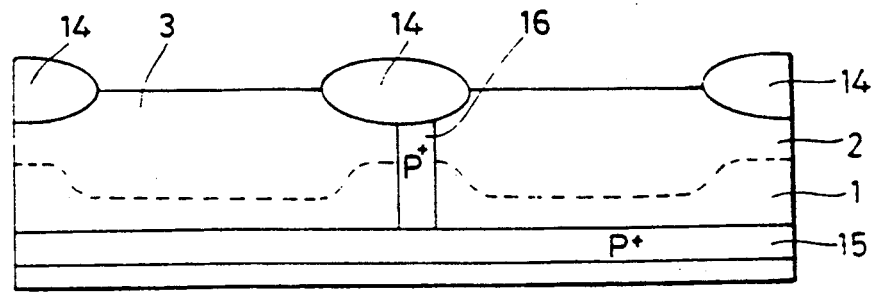
Figure 3H:
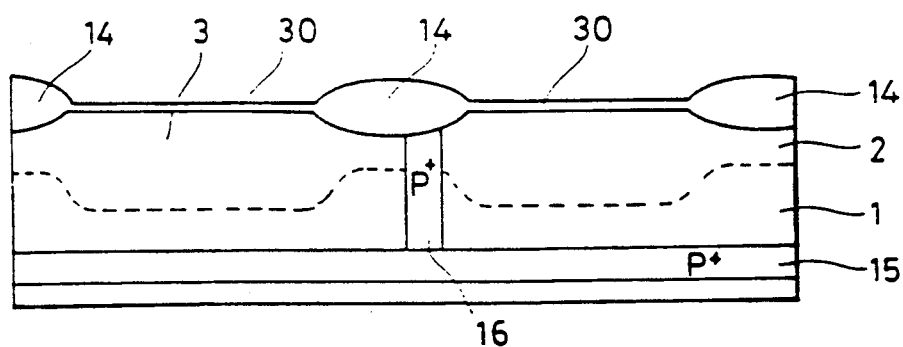
Figure 3I:
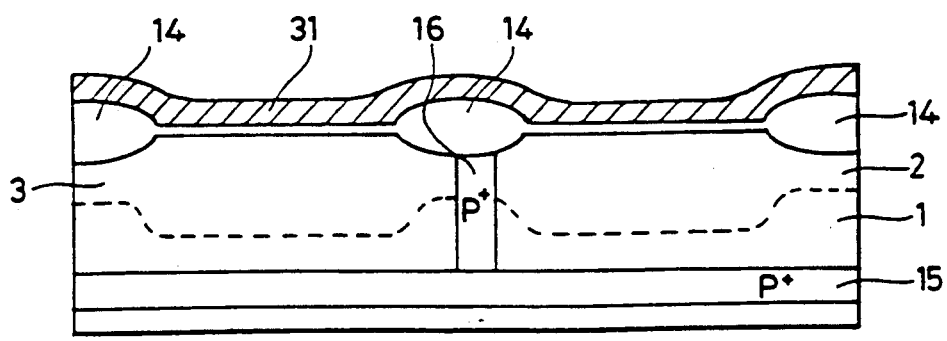
Figure 3J:
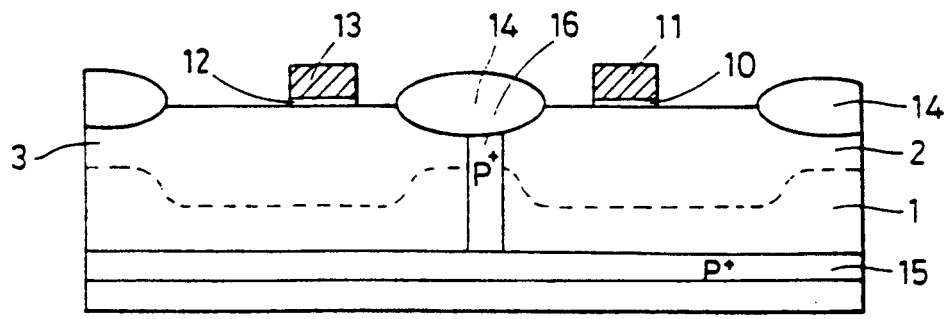
Figure 3K:
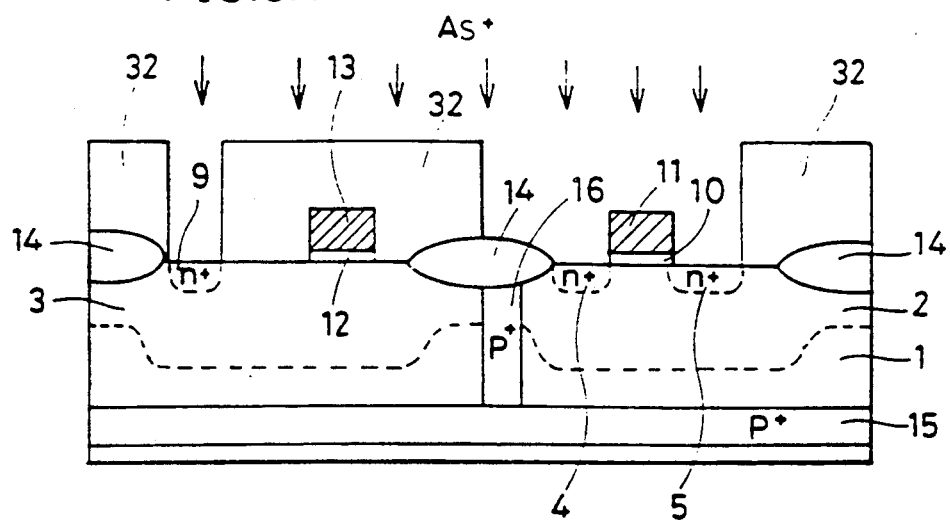
Figure 3L:
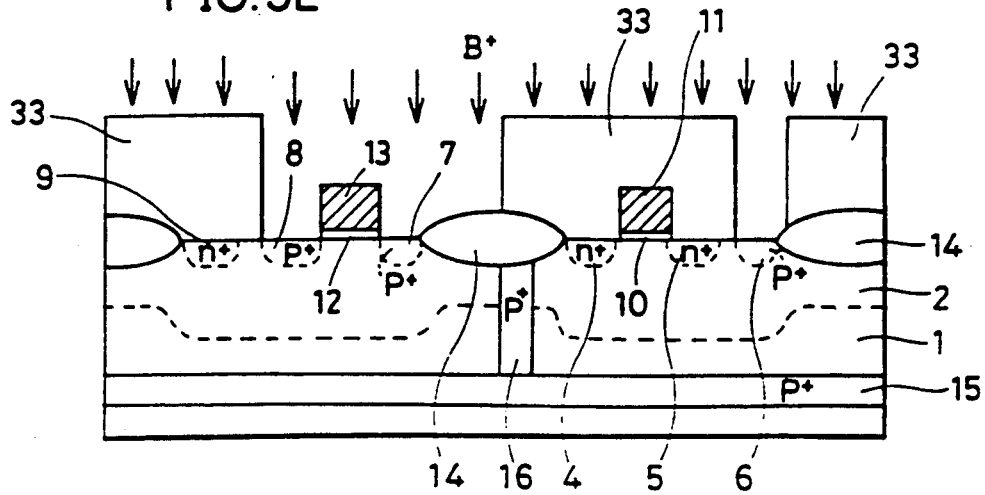
Figure 5:
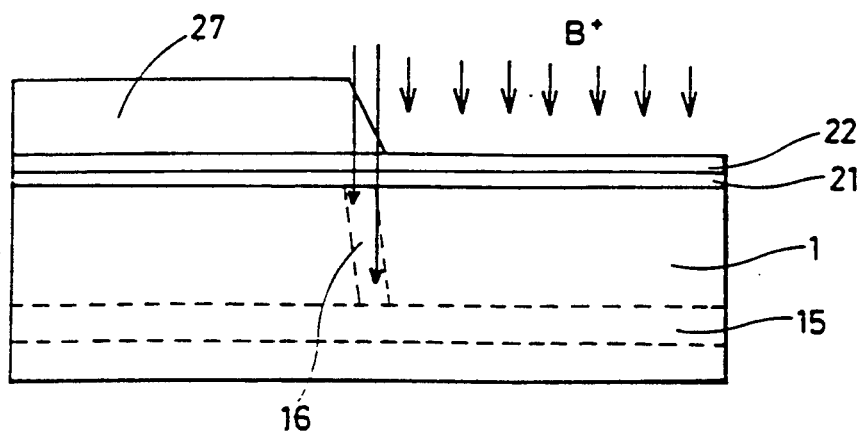
FIG. 5 is a sectional structural view in case where a resist having a gradient end surface in the manufacture process shown in FIG. 3B.

FIG. 5 is a sectional structural view in case where a resist having a gradient end surface is employed in the manufacture process shown in FIG. 3B. Referring to FIG. 5, when the end surface of the resist 27 is gradient, $B^+$ ions are decelerated at the gradient portion thereof, whereby a p+ high concentration layer 16 is formed in oblique distribution in the P-type silicon substrate 1. The gradient angle of the end surface of the resist 27 may be both an acute angle and obtuse angle. As shown in FIG. 3C, a resist 23 is patterned on a region other than the region where the nitride film 22 is formed. With the resist 23 used as a mask, the nitride film 22 is etched. As shown in FIG. 3D, the resist 23 is removed. Thermal oxidation is effected with the nitride film 22 used as a mask, thereby effecting (LOCOS) isolation and activating the p+ buried layer 15 and p+ high concentration layer 16. Thereafter, the nitride film 22 is removed. As shown in FIG. 3E, a resist 25 is patterned on a region other than the region where the N-well is to be formed. With the resist 25 used as a mask, ion implantation of phosphorus $P^+$ is effected with low energy, thereby forming the N-well. Simultaneously therewith, ion implantation of phosphorus p+ is effected with low energy, thereby forming an implanted region 26 for $V_{TH}$ control As shown in FIG. 3F, after the resist 25 is removed, a P-well resist mask 27 is patterned in a region other than the region where the P-well is to be formed. With the P-well resist mask 27 used as a mask, ion implantation of boron $B^+$ is effected with high energy, thereby forming the P-well 2. Simultaneously therewith, ion implantation of boron $B^+$ is effected with low energy, thereby forming an implanted region 28 for $V_{TH}$. As shown in FIG. 3G, after the resist 29 is removed, the oxide film 21 is removed. As shown in FIG. 3H, a gate oxide film 30 is formed in the region from which the oxide film 21 has been removed. As shown in FIG. 3I, a polysilicon film 31 serving as a gate electrode is formed on the gate oxide film 30 and field oxide film 14. As shown in FIG. 3J, the portions of the gate oxide film 30 and polysilicon film 31 which are in the regions other than the regions where they serve as the gate oxide films 12 and gate electrodes 11 and 13 are etched by photolithography. As shown in FIG. 3K, a resist 32 is patterned in a region other than the regions which are to be formed with n+ diffusion layers 4 and 5 serving as the source and drain regions in the P-well 2 and the n+ diffusion layer 9 for fixing the well potential of the N-well 3. With the resist 32 used as a mask ion implantation of As+ is effected. Thereby, n+ diffusion layers 4 and 5 serving as the source and drain regions of the P-well 2 and an n+ diffusion layer 9 for fixing the well potential of the N-well 3 are formed. As shown in FIG. 3L, a resist 33 is patterned in a region other than the regions which are to be formed with the p+ diffusion the regions which are to be formed with the p+ diffusion layers 7 and 8 serving as the source and drain regions of the N-well 3 and the p+ diffusion layer 6 for fixing the well potential of the P-well 2. With the resist 33 used as a mask, ion implantation of boron B+ is effected. Thereby, the p+ diffusion layer 7 and 8 serving as the source and drain regions of the N-well 3 and the p+ diffusion layer 6 for fixing the well potential of the P-well 2 are formed. Finally, as shown in FIG. 1, the resist 33 is removed to effect the source/drain drive for activating the impurities. Simultaneously therewith, the P-well 2 and N-well 3 are also activated. In this manner, a CMOS circuit having a latch-up preventive measure according to this embodiment applied thereto is formed. In this embodiment, since the P-well resist mask 27 used in forming the P-well 2 can be used in forming the high concentration buried layer 16, there is no need for adding a resist forming pattern for forming a resist used when forming the p+ high concentration impurity layer.

In addition, in this embodiment, the p+ buried layer 15 has been formed by implantation before the formation of the field oxide film 14; however, it may be formed by implantation after the formation of the field oxide film 14. Further, in this embodiment, a resist of the same pattern as that of the resist for forming the P-well has been used to form the p+ high concentration layer 16; however, the present invention is not limited thereto, and a resist of the same pattern as that of the resist for forming the N-well may be used to form the p+ diffusion layer 16.

Figure 6A:
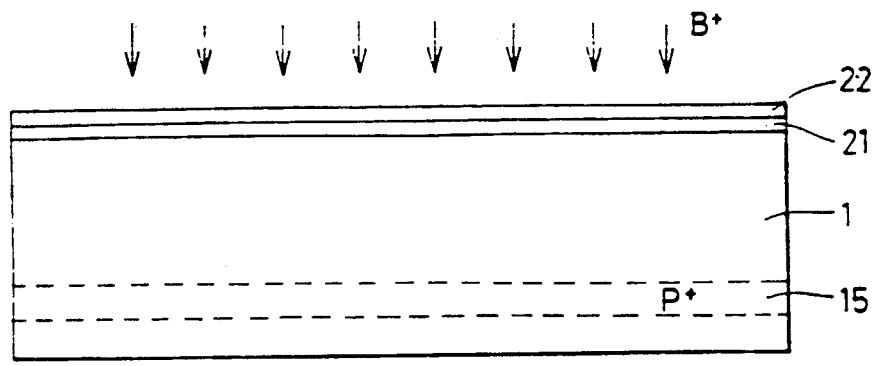
FIGS. 6A through 6F are sectional structural views for explaining another embodiment of the method of producing the CMOS circuit shown in FIG. 1.
Figure 6B:
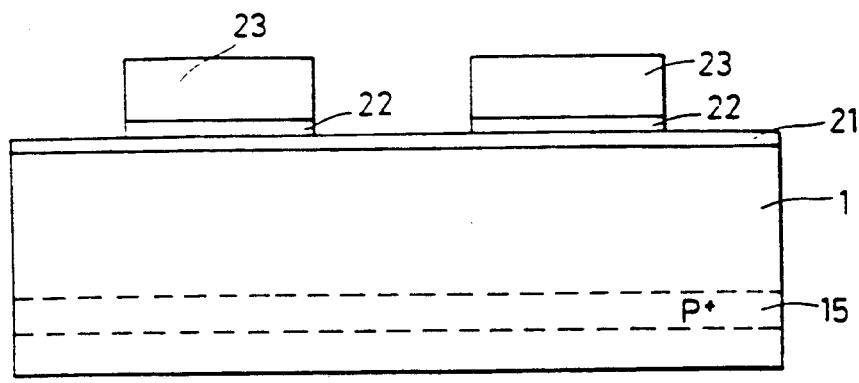
Figure 6C:
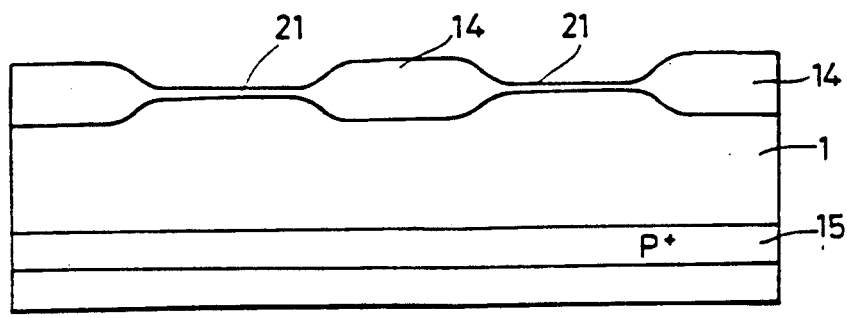
Figure 6D:
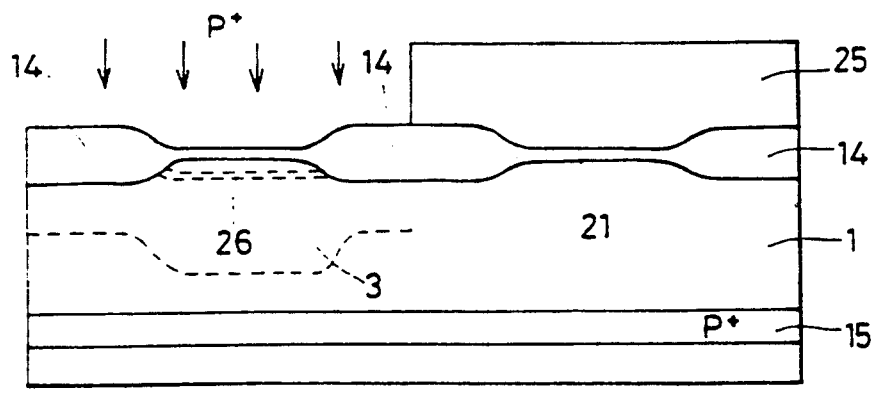
Figure 6E:
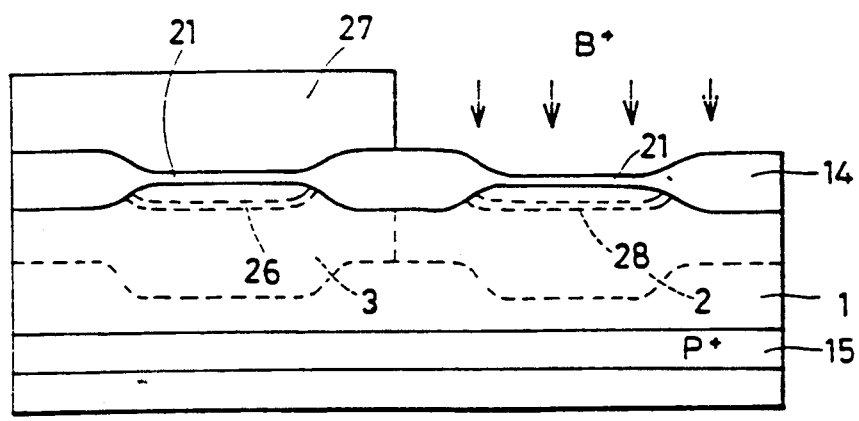
Figure 6F:
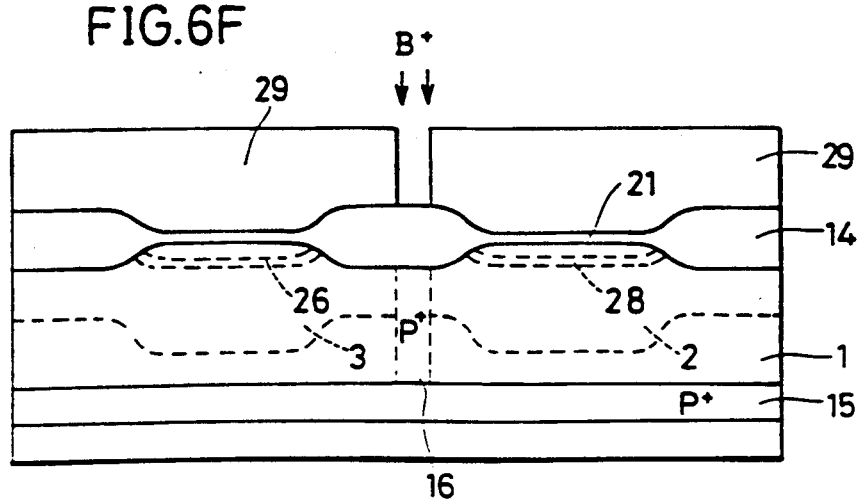

Another embodiment of the production process will now be described with reference to FIGS. 6A through 6F. As shown in FIG. 6A, an oxide film of $SiO_2$ is formed on a P-type silicon substrate 1. A nitride film 21 of $SiO_3N_4$ is formed on the oxide film 21. Thereafter, boron B+ is implanted with high energy by ion implantation method to form a p+ buried layer. As shown in FIG. 6B, a resist 33 is patterned on a region other than the region where the nitride film 22 is formed. Thereafter, with the resist 23 used as a mask, the nitride film 22 is etched. As shown in FIG. 6C, the resist 23 is removed. With the nitride film 22 used as a mask, thermal oxidation is effected, thereby forming a field oxide film 14 to effect LOCOS (Local Oxidation of Silicon) isolation and activating the p+ buried layer 15. Thereafter, the nitride film 22 is removed. As shown in FIG. 6D, a resist 25 is patterned in a region other than the region where the N-well is formed. With the resist 25 used as a mask, ion implantation of phosphorus p+ is effected with high energy, thereby forming an N-well 3. Simultaneously therewith, ion implantation of phosphorus P+ is effected with low energy, thereby forming an implanted region 26 for $V_{TH}$ control As shown in FIG. 6E, after the resist is removed, a resist 27 is patterned in a region other than the region where the P-well is formed. With the resist 27 used as a mask, ion implantation of boron B+ is effected with high energy, thereby forming the P-well 2. Simultaneously therewith, ion implantation of boron B+ is effected with low energy, thereby forming a region 28 for $V_{TH}$. As shown in FIG. 6F, the resist 27 is removed and a resist 29 is patterned which opens in the portion of the P-well 2 which is adjacent the N-well 3. With the resist 29 used as a mask, at least one ion implantation of boron B+ is effected with high energy (for example, 200 KeV—10 MeV, forming a p+ high concentration layer 16. The subsequent process is the same as that shown in FIGS. 3G through 3L and hence a description thereof is omitted.

As described above, with the production method shown in FIGS. 4A through 4F, boron B+ is implanted directly in the P-type silicon substrate 1 without intermediary of a mask; therefore, it is possible to increase the impurity concentration of the p+ high concentration layer 16, as compared with the production method shown in FIG. 3L. As a result, the latch-up preventive property can be further intensified.

Figure 7:
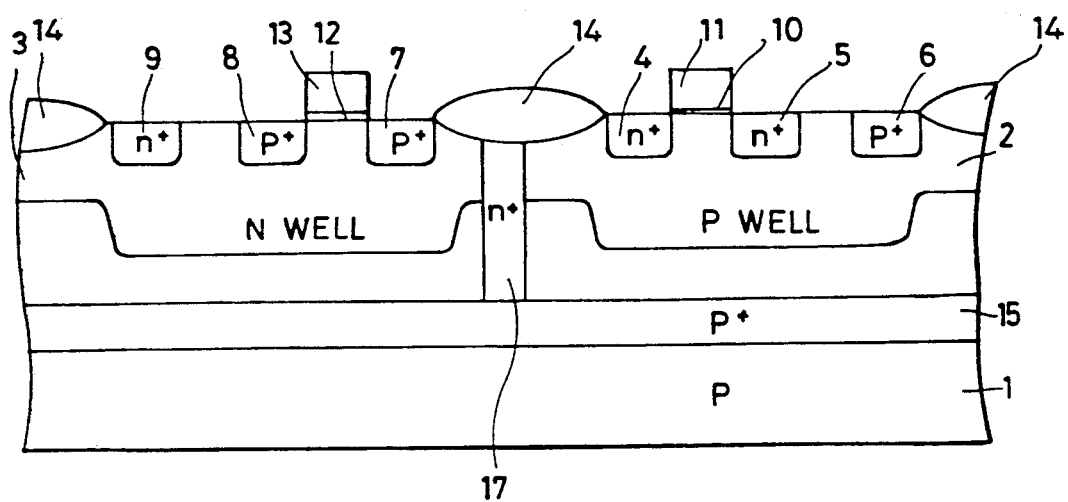
FIGS. 7 and 8 are sectional structural views of a CMOS circuit having another latch-up preventive measure applied thereto, showing another embodiment of the invention.
Figure 8:
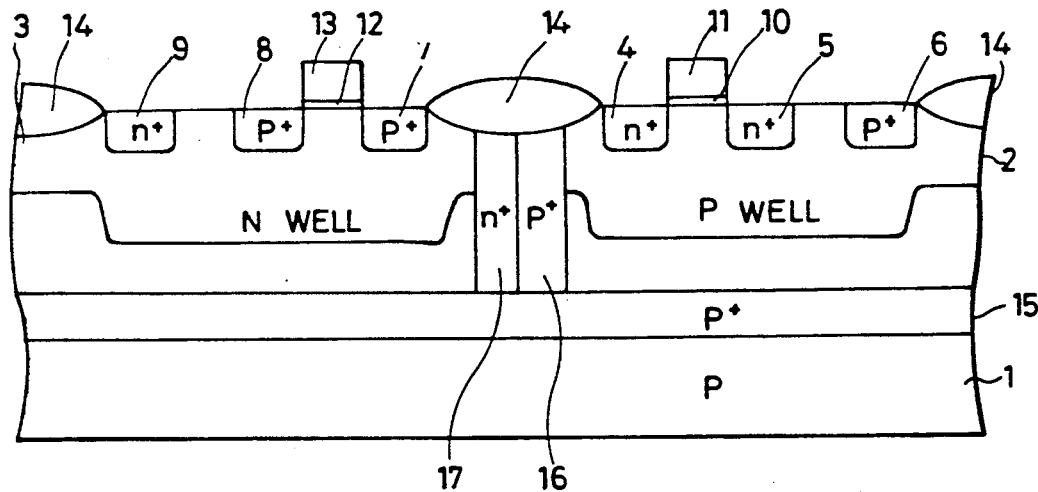
Figure 9A:
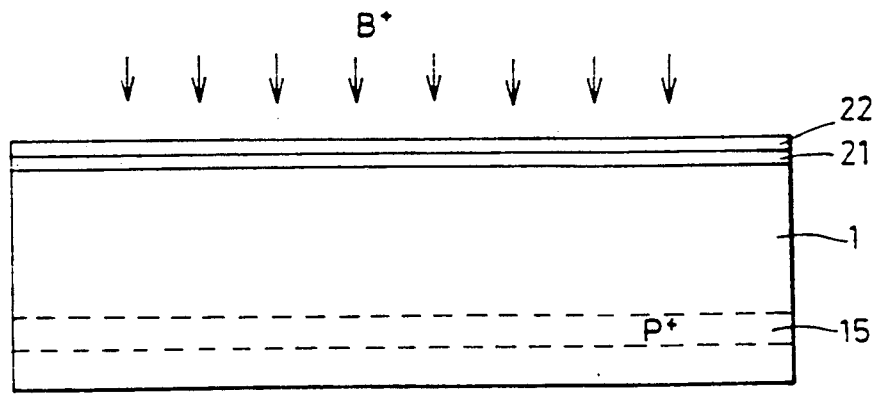
FIGS. 9A through 9M are sectional structural views for explaining a process for producing a CMOS circuit having a conventional latch-up preventive measure applied thereto.
Figure 9B:
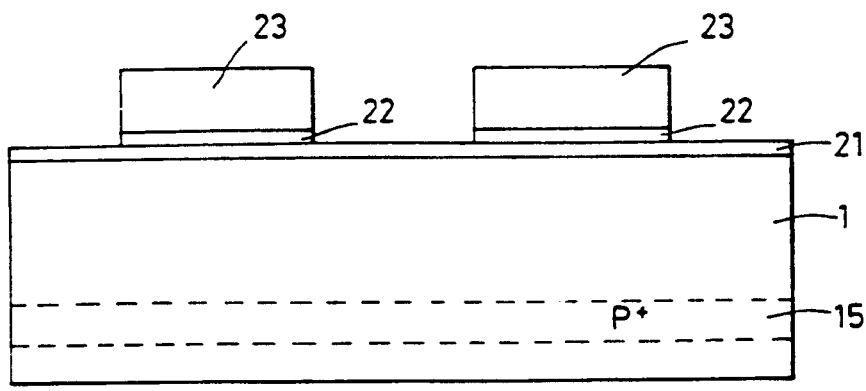
Figure 9C:
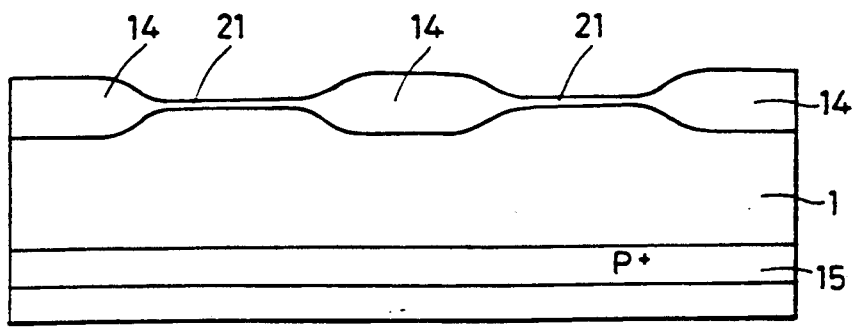
Figure 9D:
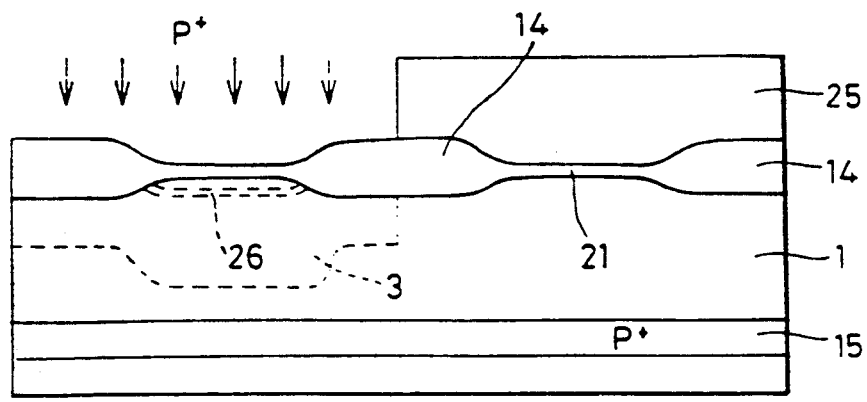
Figure 9E:
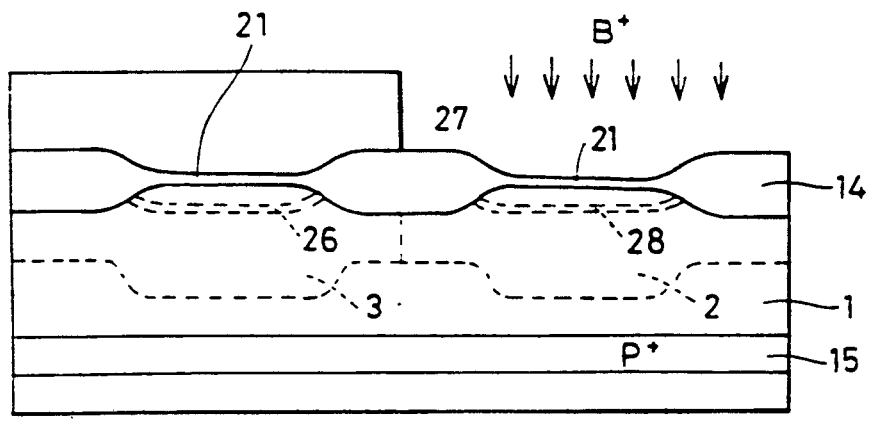
Figure 9F:
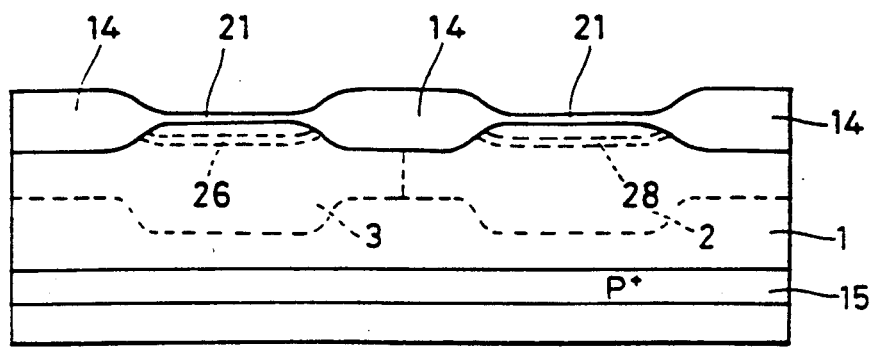
Figure 9G:
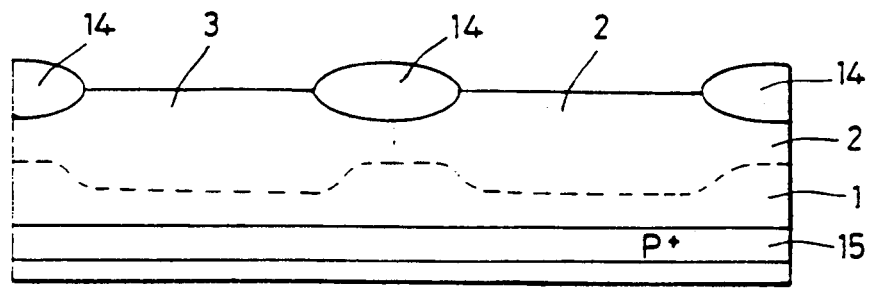
Figure 9H:
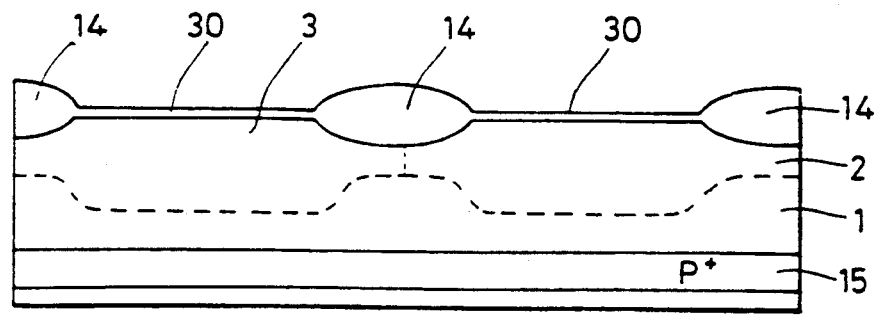
Figure 9I:
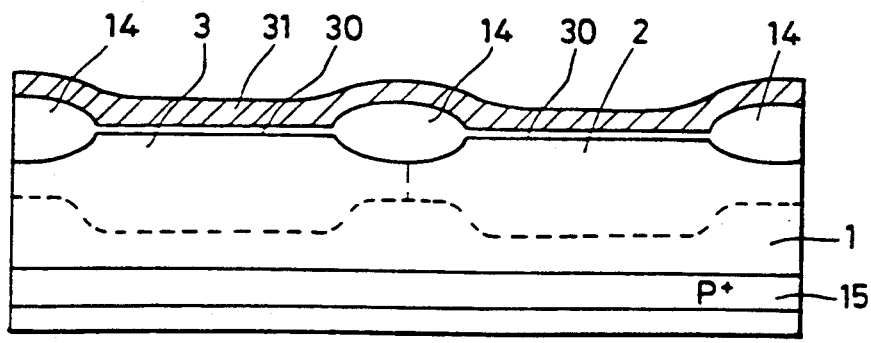
Figure 9J:
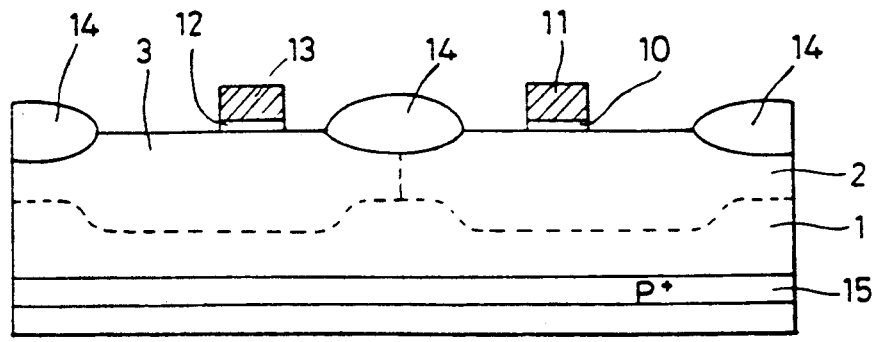
Figure 9K:
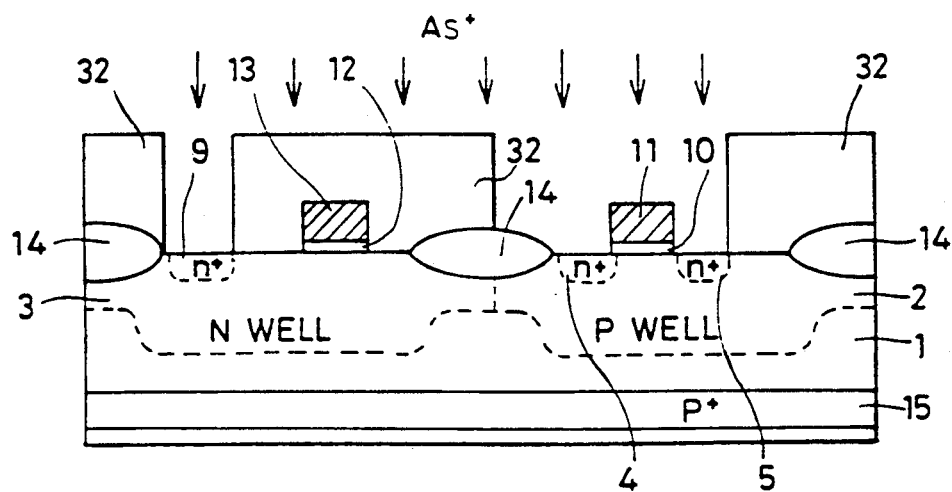
Figure 9L:
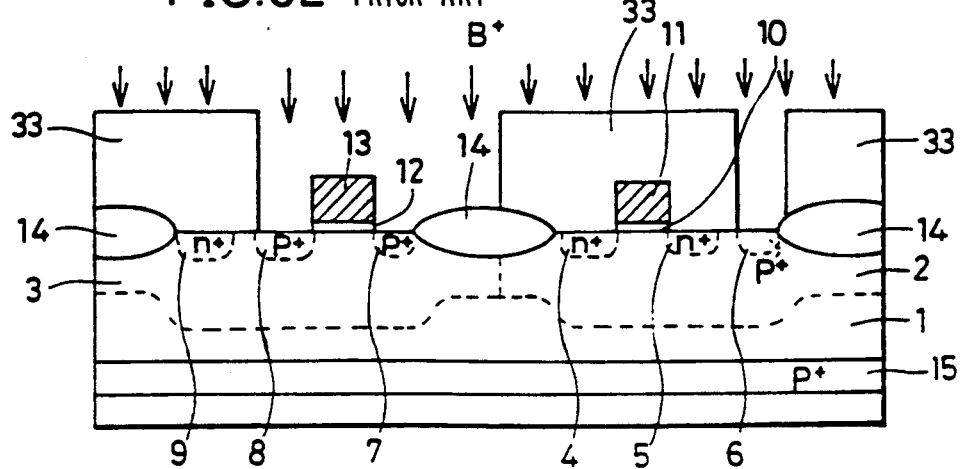
Figure 9M:
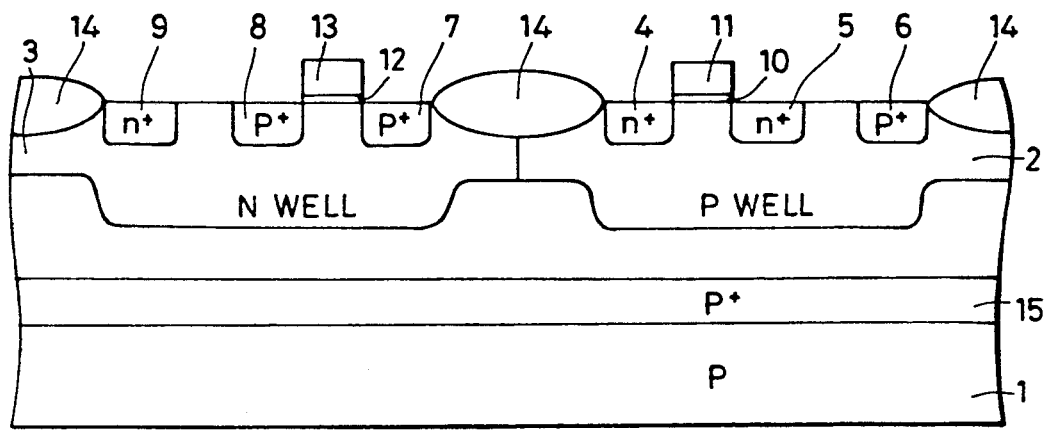
Figure 10:
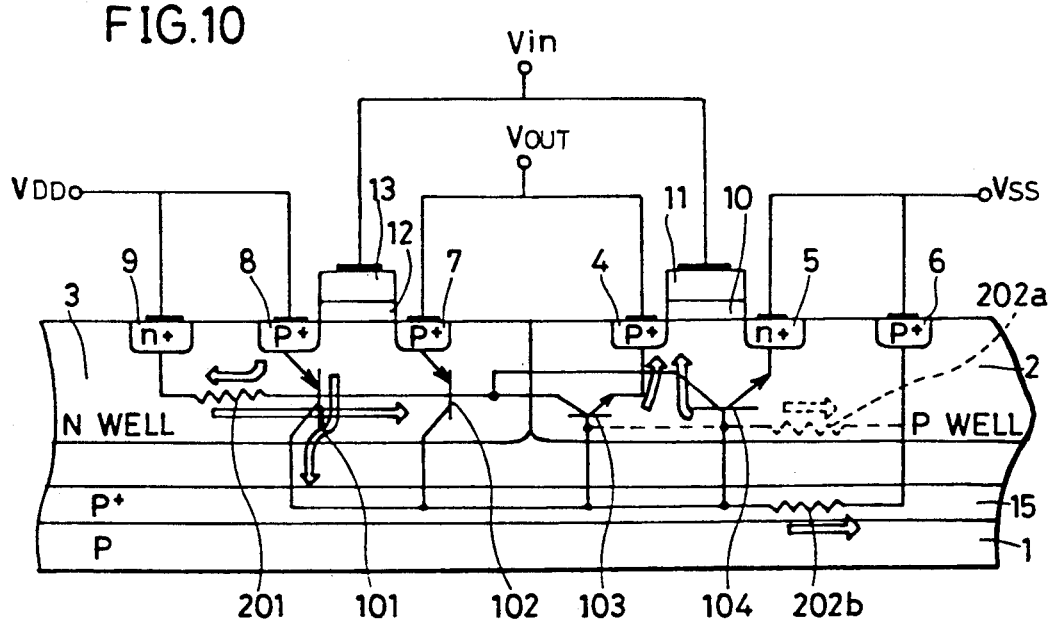
Figure 11:
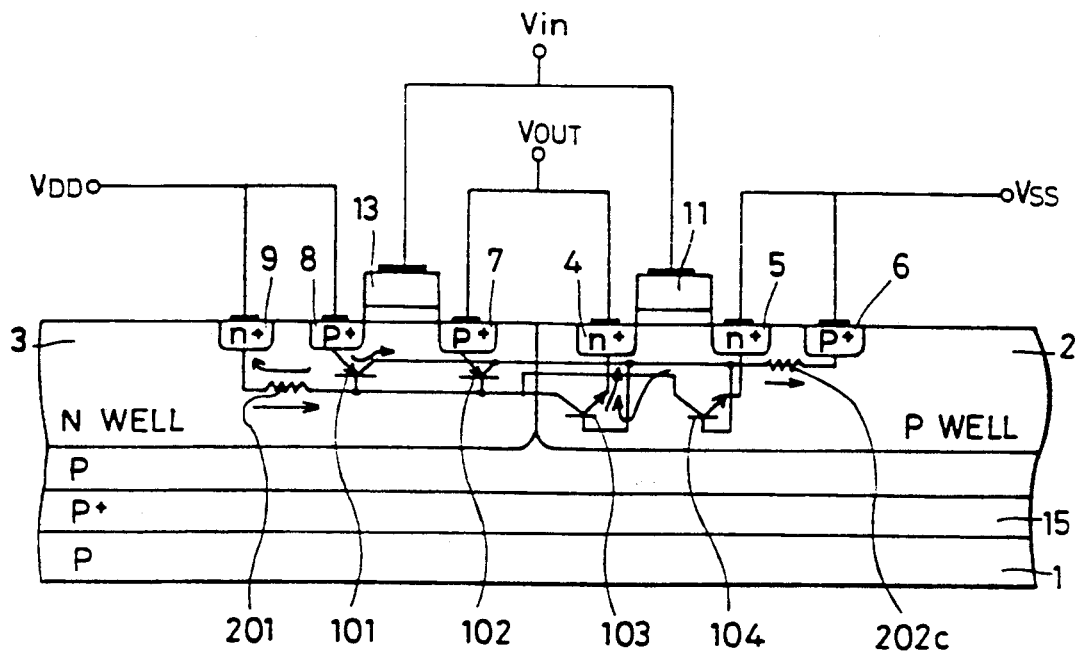
FIG. 11 is a schematic view for explaining parasitic transistors and bulk-resistance components when CMOS circuits are made finer.

Referring to FIG. 7, even if an n+ high concentration layer 17 is formed in the boundary region between the N-well and the P-well 2, the same effect as that of the CMOS circuit shown in FIG. 1 can be obtained. Referring to FIG. 8, a p+ high concentration layer 16 and an n+ high concentration 17 are formed in the P-well 2 and the N-well 3, respectively. This arrangement is more effective in preventing latch-up even if the distance between the emitters of parasitic transistors is short. That is, the p+ high concentration layer 16 causes a decrease in the gains of the PNP transistors 101 and 102, and the n+ high concentration layer 17 causes a decrease in the gains of the NPN transistors 103 and 104, whereby a latch-up preventive function is further intensified.

As described above, in the CMOS circuit shown in FIG. 1, the formation of the p+ high concentration layer 16 in the portion of the P-well 2 bordering the N-well 3 lowers the gains of the NPN transistors 103 and 104, decreasing the current flowing through the bulk-resistance 201 which forms the cause of raising the base potentials of the PNP transistors 101 and 102; thus, it becomes harder for the PNP transistors to turn on. As result, it becomes harder for the NPN transistors 103 and 104 to turn on; thus, latch-up can be effectively prevented even if the distance between the emitters of parasitic transistors is short.

In the CMOS producing method shown in FIGS. 3A through 3L, since the P-well resist mask 27 used in forming the P-well 2 can be used in forming the high concentration buried layer 16, there is no need of adding a resist forming pattern for forming a resist which is used in forming the p+ high concentration buried layer 16.

In another method for producing CMOS shown in FIGS. 6A through 6F, since boron B+ is implanted directly in the P-type silicon substrate 1, the impurity concentration in the p+ high concentration layer 16 can be further increased, as compared with the production method shown in FIGS. 3A through 3L. As a result, the latch-up preventive property can be further intensified.

As described above, in the complementary field effect elements, a high concentration impurity layer is formed by ion implantation in the boundary region between a first electrically conductive-type impurity layer and a second electrically conductive-type impurity layer, thereby lowering the gains of parasitic transistors with respect to carriers passing through the boundary region between the first and second electrically conductive-type impurity layers; thus, an intensified latch-up preventive property is obtained even if the distance between the emitters of parasitic transistors is short.

In another production method of the invention, the same resist as that used in forming the first or second electrically conductive-type impurity layer is used in effecting ion implantation to form a high concentration impurity layer, said ion implantation being of the same implantation intensity as when forming the high concentration buried layer in the boundary region between the regions where the first and second electrically conductive-type impurities are formed. Thus, the high concentration buried layer is formed without adding a resist forming pattern for forming the resist which is used for forming the high concentration impurity layer. Therefore, the high concentration impurity layer can be formed without complicating the production apparatus.

In another production method of the invention, a resist is formed which opens with a predetermined width at a position corresponding to the boundary region between first and second electrically conductive-type impurity layers on a first electrically conductive-type semiconductor substrate, and this resist is used in forming by ion implantation a high concentration impurity layer in a boundary region between the first and second electrically conductive-type impurity layers. Thus, ions are implanted directly in the semiconductor substrate without the impurities passing directly through the resist, so that the impurity concentration of the high concentration impurity layer can be further increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having first and second type field effect transistors, comprising:
    a first electrically conductive-type substrate having a main surface;
    a first electrically conductive-type impurity layer as a first well within which is formed the first type field effect transistor and a second electrically conductive-type impurity layer as a second well within which is formed the second type field effect transistor, said first and second electrically conductive-type impurity layers formed adjacent each other in the main surface of said first electrically conductive-type semiconductor substrate;
    a first electrically conductive-type buried layer of an impurity concentration density greater than that of said first conductivity-type substrate in a region thereof underlying the first and second electrically conductive-type impurity regions;
    a thick field oxide film formed between said first and second electrically conductive-type impurity layers in the main surface of said first electrically conductive-type semiconductor substrate; and
    an impurity layer of a single material having a single impurity concentration density greater than that of said first conductive-type substrate formed between the first and second electrically conductive-type impurity layers, extending from said thick field oxide film to said first electrically conductive-type buried layer wherein said impurity layer is in electrical contact with said first well and said second well;
    wherein said impurity layer includes a first electrically conductive-type high concentration layer.

2. The device of claim 1, wherein
    said first and second electrically conductive-type impurity layers each has a stepped portion wherein portions of said impurity layers underlying said thick field oxide film extend into said first electrically conductive-type substrate a first distance from said main surface and other portions of each of said electrically conductive-type impurity layers extend into said first electrically conductive-type substrate a second distance from said main surface, said second distance being greater than said first distance.

3. A semiconductor device having first and second type field effect transistors, comprising:
    a first electrically conductive substrate having a main surface;
    a first electrically conductive-type impurity layer as a first well within which is formed the first type field effect transistor and a second electrically conductive-type impurity layer as a second well within which is formed the second type field effect transistor, said first and second electrically conductive-type impurity layers formed adjacent each other in the main surface of said first electrically conductive-type semiconductor substrate;
    a first electrically conductive-type buried layer of an impurity concentration density greater than that of said first conductive-type substrate in a region thereof underlaying the first and second electrically conductive-type impurity regions;
    a thick field oxide film formed between said first and second electrically conductive-type impurity layers in the main surface of said first electrically conductive-type semiconductor substrate; and
    an impurity layer having an impurity concentration density greater than that of said first conductive-type substrate and formed between the first and second electrically conductive-type impurity layers, extending from said thick field oxide film to said first electrically conductive-type buried layer, said impurity layer including both first and second electrically conductive-type high concentration impurity layers.

4. A semiconductor device having first and second type field effect transistors as set forth in claim 3, wherein
    said first electrically conductive-type high concentration layer is formed in a region of said first electrically conductive-type impurity layer which is adjacent said second electrically conductive-type impurity layer while said second electrically conductive-type high concentration layer is formed in a region of said second electrically conductive-type impurity layer which is adjacent said first electrically conductive-type impurity layer.

* * * * *